(12) United States Patent
Chu et al.

(10) Patent No.: US 12,602,096 B2
(45) Date of Patent: Apr. 14, 2026

(54) MANAGING A THERMAL POLICY OF AN INFORMATION HANDLING SYSTEM

(71) Applicant: Dell Products L.P., Round Rock, TX (US)

(72) Inventors: TseAnGino Chu, Zhongshan District (TW); Ting-Chiang Huang, New Taipei (TW); Chung-Wei Wang, Taipei (TW); Qinghong He, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 793 days.

(21) Appl. No.: 17/813,127

(22) Filed: Jul. 18, 2022

(65) Prior Publication Data

US 2024/0019915 A1     Jan. 18, 2024

(51) Int. Cl.
*G06F 1/20* (2006.01)
*G06F 9/48* (2006.01)
*H05K 7/20* (2006.01)

(52) U.S. Cl.
CPC ............ *G06F 1/206* (2013.01); *G06F 9/4893* (2013.01); *H05K 7/20209* (2013.01)

(58) Field of Classification Search
CPC .... G06F 1/206; G06F 9/4893; H05K 7/20209
See application file for complete search history.

(56) References Cited

U.S. PATENT DOCUMENTS

2011/0055596 A1* 3/2011 Wyatt ................... G06F 1/3203
                                                        345/212
2021/0068302 A1* 3/2021 North .................... G06F 9/5055

* cited by examiner

*Primary Examiner* — Kim Huynh
(74) *Attorney, Agent, or Firm* — McDermott Will & Schulte LLP

(57)                ABSTRACT

A computer-implemented method of managing a thermal policy of an information handling system involves identifying a first power associated with a central processing unit (CPU) of the information handling system, identifying a first time duration of a first workload associated with the CPU, accessing a table indicating, for combinations of workload time durations and CPU power, a ramp rate and a thermal management mode, comparing the first power and the first time duration with the table to identify a first ramp rate and a first thermal management mode associated with the first power and the first time duration, and placing the CPU and a fan of the information handling system in the first thermal management mode and adjusting a fan speed of the fan based on the first ramp rate.

11 Claims, 5 Drawing Sheets

MANAGING A THERMAL POLICY OF AN INFORMATION HANDLING SYSTEM

BACKGROUND

Field of the Disclosure

The disclosure relates generally to an information handling system, and in particular, managing a thermal policy of the information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Innovative aspects of the subject matter described in this specification may be embodied in a computer-implemented method of managing a thermal policy of an information handling system. The method comprises identifying, at a first time, a first power associated with a central processing unit (CPU) of the information handling system; identifying, at the first time, a first time duration of a first workload associated with the CPU; accessing a table indicating, for combinations of workload time durations and CPU power, a ramp rate and a thermal management mode; comparing the first power and the first time duration with the table to identify a first ramp rate and a first thermal management mode associated with the first power and the first time duration; and placing the CPU and a fan of the information handling system in the first thermal management mode and adjusting a fan speed of the fan based on the first ramp rate.

Other embodiments of these aspects include corresponding systems, apparatus, and computer programs, configured to perform the actions of the methods, encoded on computer storage devices.

These and other embodiments may each optionally include one or more of the following features. For instance, in some embodiments, the ramp rate is a rate of change of the fan speed of the fan. In some embodiments, the thermal management mode indicates the fan speed of the fan and a processing parameter of the CPU. In some embodiments, the method further comprises identifying, at a second time after the first time, a second power associated with a central processing unit (CPU) of the information handling system; identifying, at the second time, a second time duration of a second workload associated with the CPU; assessing the table; comparing the second power and the second time duration with the table to identify a second ramp rate and a second thermal management mode associated with the second power and the second time duration; and placing the CPU and the fan in the second thermal management mode and adjusting the fan speed of the fan based on the second ramp rate. In some embodiments, the second ramp rate is greater than the first ramp rate. In some embodiments, the fan speed of the second thermal management mode is greater than the fan speed of the first thermal management mode, and the processing parameter of the second thermal management mode is greater than the processing parameter of the first thermal management mode. In some embodiments, the method further comprises determining that the thermal policy is not enabled; and in response to determining that the thermal policy is not enabled, setting the thermal management mode to a default setting.

Particular implementations of the subject matter described in this specification can be implemented so as to realize one or more of the following advantages. For example, a noise of a fan of an information handling system can be quieter during light workloads, while improved thermal capacity in heavier workloads.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

Figure 1:
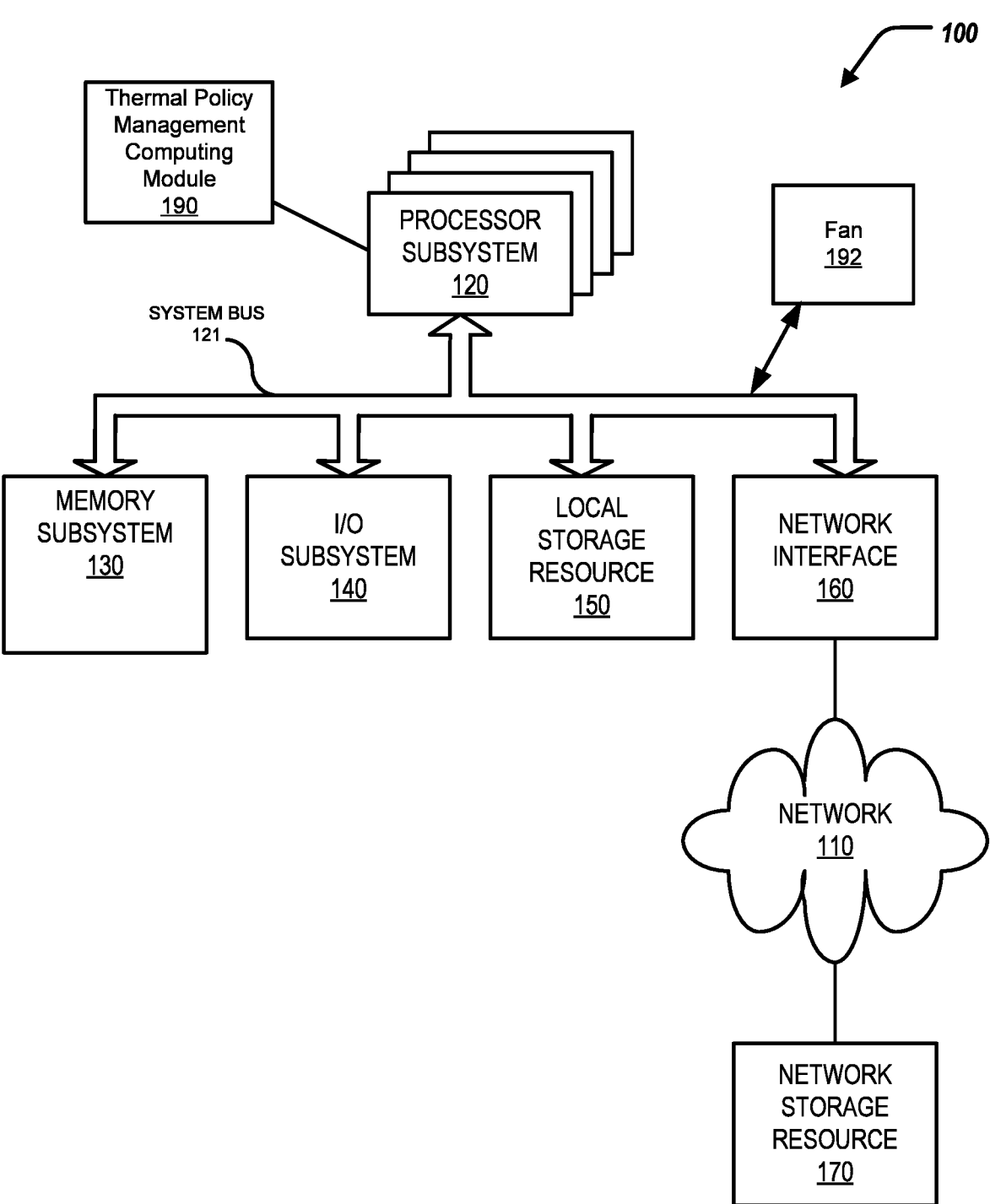
FIG. 1 is a block diagram of selected elements of an embodiment of an information handling system.

This disclosure discusses methods and systems for managing a thermal policy at an information handling system. In short, dynamically changing thermal modes of the information handling system can be performed based on real-time CPU power and workload duration.

Specifically, this disclosure discusses a system and a method for managing a thermal policy of an information handling system, including identifying, at a first time, a first power associated with a central processing unit (CPU) of the information handling system; identifying, at the first time, a first time duration of a first workload associated with the CPU; accessing a table indicating, for combinations of workload time durations and CPU power, a ramp rate and a thermal management mode; comparing the first power and the first time duration with the table to identify a first ramp rate and a first thermal management mode associated with the first power and the first time duration; and placing the CPU and a fan of the information handling system in the first thermal management mode and adjusting a fan speed of the fan based on the first ramp rate.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-5 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

The information handling system can further include a fan 192.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

The information handling system 100 can also include a thermal policy management computing module 190. The thermal policy management computing module 190 can be associated with or included by the processor subsystem 120.

In short, the thermal policy management computing module 190 can facilitate dynamically changing thermal modes of the information handling system 202 based on real-time CPU power and workload duration.

Figure 2:
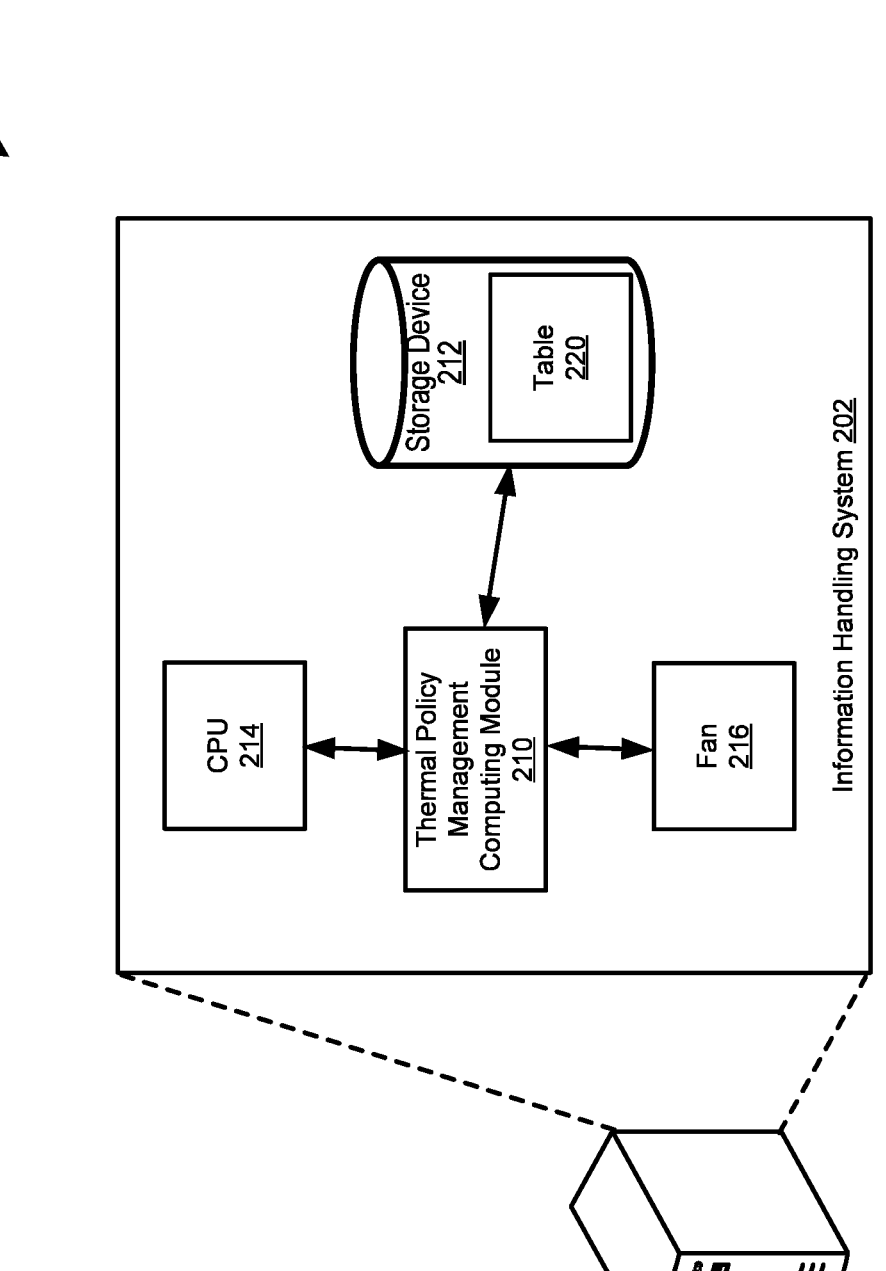
FIG. 2 illustrates a block diagram of the information handling system.

Turning to FIG. 2, FIG. 2 illustrates an environment 200 including an information handling system 202. The information handling system 202 can include a thermal policy management computing module 210, a storage device 212, a central processing unit (CPU) 214, and a fan 216. In some examples, the information handling system 202 is similar to, or includes, the information handling system 100 of FIG. 1. In some examples, the thermal policy management computing module 210 is the same, or substantially the same, as the thermal policy management computing module 190 of FIG. 1. In some examples, the storage device 212 is the same, or substantially the same, as the memory subsystem 130 of FIG. 1. In some examples, the CPU 214 is the same, or substantially the same, as the processor subsystem 120 of FIG. 1. In some examples, the fan 216 is the same, or substantially the same, as the fan 192 of FIG. 1.

The thermal policy management computing module 210 is communication with the storage device 212, the CPU 214, and the fan 216.

Figure 3:
FIGS. 3, 4 illustrates respective methods for managing a thermal policy at the information handling system.
Figure 3:
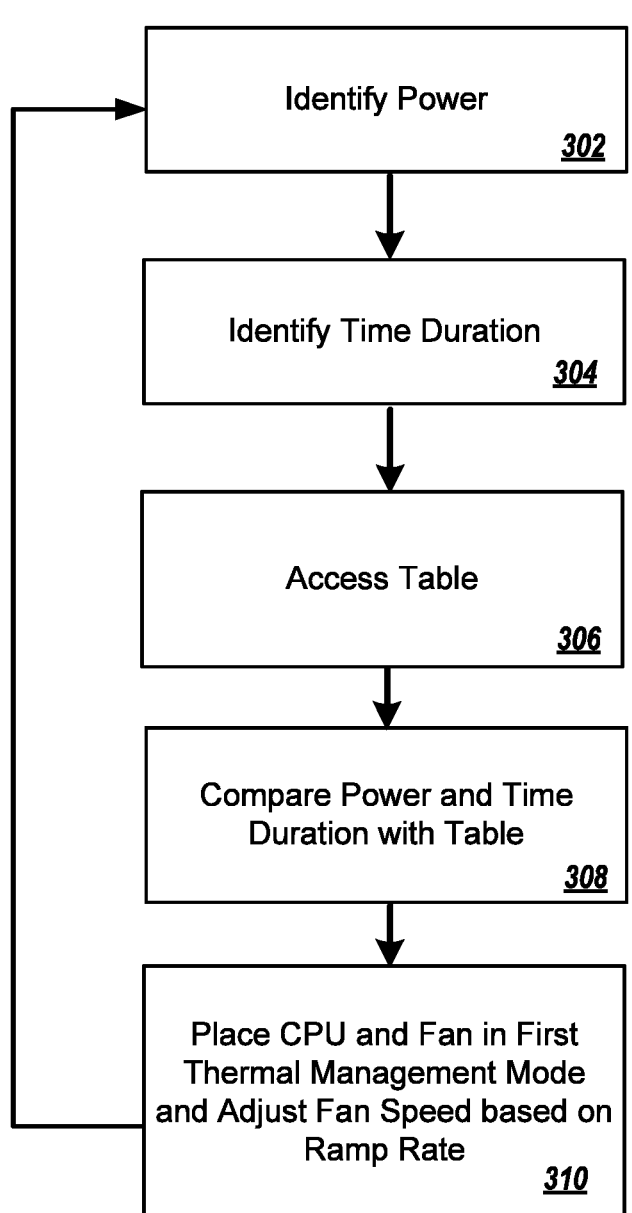

FIG. 3 illustrates a flowchart depicting selected elements of an embodiment of a method 300 for managing a thermal policy at the information handling system 202. The method 300 may be performed by the information handling system 100, the information handling system 202, and/or thermal policy management computing module 210, and with reference to FIGS. 1-2. It is noted that certain operations described in method 300 may be optional or may be rearranged in different embodiments.

The thermal policy management computing module 210 identifies, at a first time, a first power associated with the CPU 214, at 302. The first power can be a wattage (W) currently associated with the CPU 214. That is, the first power can be an amount of power (wattage) currently being consumed by (or consumed at) the CPU 214.

The thermal policy management computing module 210 identifies, at the first time, a first time duration of a first workload associated with the CPU 214, at 304. The first time duration of the first workload can be in seconds or minutes. That is, the thermal policy management computing module 210 identifies, at the first time and for a first workload performed at the CPU 214, a first power of the CPU 214 when performing the first workload and a first time duration for performing the first workload.

The thermal policy management computing module 210 can access a table 220 stored by the storage device 212, at 306. The table 220 can include, for combinations of workload time durations of the CPU 214 and power consumed at the CPU 214, a particular fan speed (RPM) ramp rate and a particular thermal management mode of the information handling system 202. That is, the table 220 can indicate, for combinations of workload time durations of the CPU 214 and power consumed at the CPU 214, a particular fan speed (RPM) ramp rate and a particular thermal management mode for the particular combination of workload time duration of the CPU 214 and the power consumed at the CPU 214.

In some examples, the table 220 can indicate that a particular thermal management mode and a particular ramp rate can correspond to a range of values for the power and the time durations. For example, a particular thermal management and a particular ramp rate can correspond to a power of the CPU 214 within a first range of values and a time duration of the workload with a second range of values.

In some examples, the ramp rate is a rate of change of the fan speed of the fan 216 (in revolutions per minute). That is, the ramp rate is the rate of change of the fan speed of the fan 216 from a current RPM to a target RPM.

In some examples, the thermal management mode indicates the fan speed of the fan 216 and a processing parameter of the CPU 214. For example, the thermal management mode can indicate a target fan speed (RPM) of the fan 216, and a processing parameter of the CPU 214 can indicate a processing speed/capability of the CPU 214. For example, a first thermal management mode can indicate an increased fan speed and reduced processing capability of the CPU 214

("cool" thermal management mode). For example, a second thermal management mode can indicate a reduced fan speed and a reduce processing capability of the CPU 214 ("quiet" thermal management mode). For example, a third thermal management mode can indicate an increased fan speed and an increased processing capability of the CPU 214 ("performance" thermal management mode).

The thermal policy management computing module 210 can compare the first power and the first time duration with the table 220, at 308. That is, the thermal policy management computing module 210 compares the first power of the CPU 214 at the first time and the first time duration of the first workload associated with the CPU 214 at the first time with the table. The thermal policy management computing module 210, based on the comparing, identifies a first ramp rate and a first thermal management mode associated with the first power and the first time duration as indicated by the table 220. That is, for the particular combination of the first power and the first time duration, the table 220 indicates a corresponding first ramp rate and corresponding first thermal management mode.

The thermal policy management computing module 210 places the CPU 214 and the fan 216 in the first thermal management mode and adjusts the fan speed of the fan 216 based on the first ramp rate, at 310. That is, the thermal policy management computing module 210 adjust the processing power/capability of the CPU 214 based on the first thermal management mode identified from the table 220 for the first power of the CPU 214 and the first time duration of the first workload performed at the CPU 214. Further, the thermal policy management computing module 210 adjusts the fan speed of the fan 216 based on the first thermal management mode identified from the table 220 for the first power of the CPU 214 and the first time duration of the first workload performed at the CPU 214. Moreover, the thermal policy management computing module 210 adjusts the ramp rate of the fan 216 to achieve the first fan speed of the fan 216 based on the first ramp rate identified from the table 220 for the first power of the CPU 214 and the first time duration of the first workload performed at the CPU 214.

After placing the CPU 214 and the fan 216 in the first thermal management mode and adjusting the fan speed of the fan 216 at the first time, the process returns to step 302.

The thermal policy management computing module 210 identifies, at a second time after the first time, a second power associated with the CPU 214, at 302.

The thermal policy management computing module 210 identifies, at the second time, a second time duration of a second workload associated with the CPU 214, at 304. That is, the thermal policy management computing module 210 identifies, at the second time and for a second workload performed at the CPU 214, a second power of the CPU 214 when performing the second workload and a second time duration for performing the second workload.

The thermal policy management computing module 210 accesses the table 220 stored by the storage device 212, at 306.

The thermal policy management computing module 210 compares the second power and the second time duration with the table 220, at 308. That is, the thermal policy management computing module 210 compares the second power of the CPU 214 at the second time and the second time duration of the second workload associated with the CPU 214 at the second time with the table 220. The thermal policy management computing module 210, based on the comparing, identifies a first ramp rate and a first thermal management mode associated with the first power and the first time duration as indicated by the table 220. That is, for the particular combination of the second power and the second time duration, the table 220 indicates a corresponding second ramp rate and corresponding second thermal management mode.

The thermal policy management computing module 210 places the CPU 214 and the fan 216 in the second thermal management mode and adjusts the fan speed of the fan 216 based on the second ramp rate, at 310. That is, the thermal policy management computing module 210 adjust the processing power/capability of the CPU 214 based on the second thermal management mode identified from the table 220 for the second power of the CPU 214 and the second time duration of the second workload performed at the CPU 214. Further, the thermal policy management computing module 210 adjusts the fan speed of the fan 216 based on the second thermal management mode identified from the table 220 for the second power of the CPU 214 and the second time duration of the second workload performed at the CPU 214. Moreover, the thermal policy management computing module 210 adjusts the ramp rate of the fan 216 to achieve the second fan speed of the fan 216 based on the second ramp rate identified from the table 220 for the second power of the CPU 214 and the second time duration of the second workload performed at the CPU 214.

In some examples, the second ramp rate is greater than the first ramp rate.

In some examples, the fan speed of the second thermal management mode is greater than the fan speed of the first thermal management mode.

In some examples, the processing parameter (processing speed/capability of the CPU 214) of the second thermal management mode is greater than the processing parameter (processing speed/capability of the CPU 214) of the first thermal management mode.

After placing the CPU 214 and the fan 216 in the second thermal management mode and adjusting the fan speed of the fan 216 at the second time at the second ramp rate, the process returns to step 302. The process 300 can be performed iteratively such that the thermal management mode and the fan speed of the fan 216 is updated continuously/dynamically.

Figure 4:
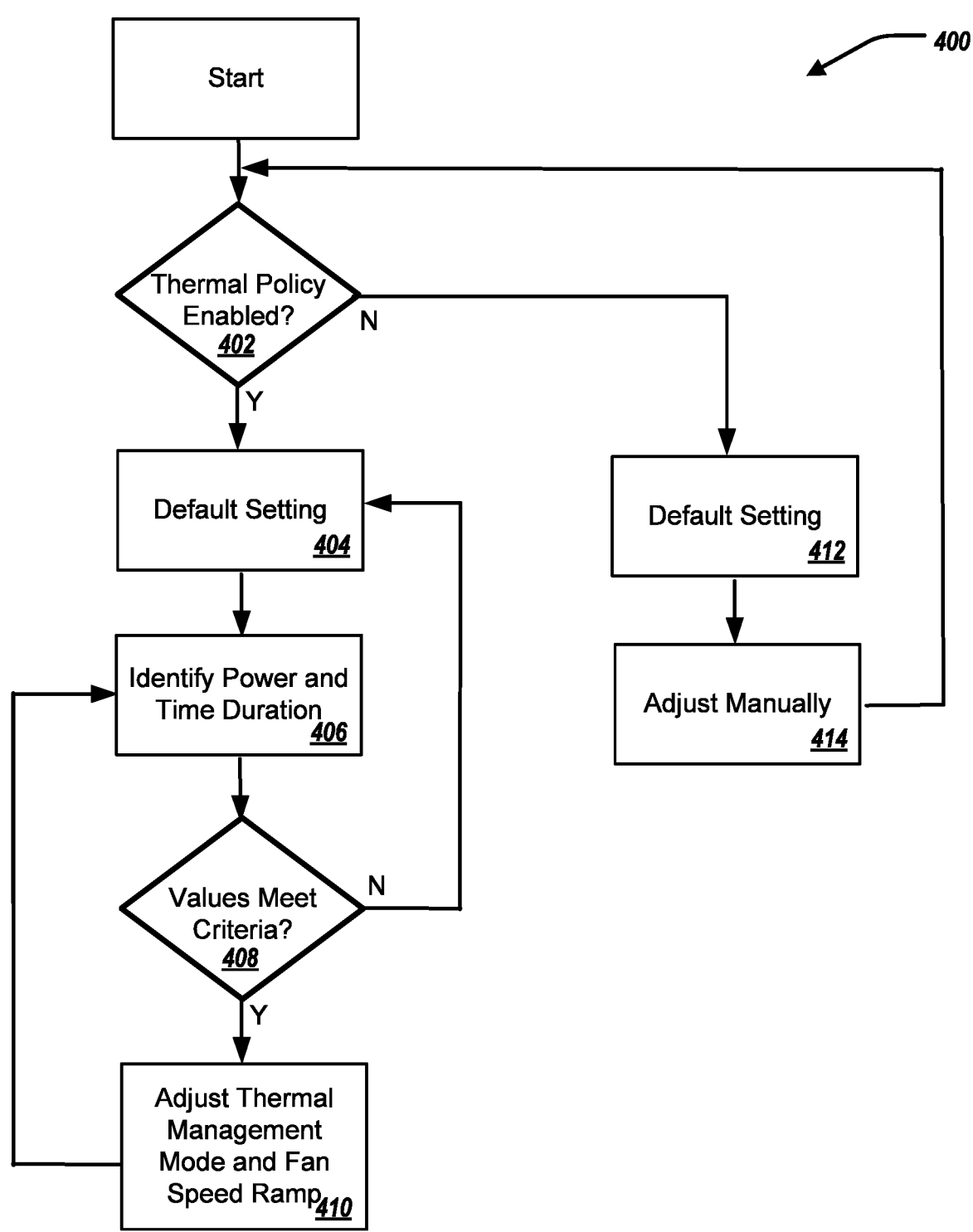

FIG. 4 illustrates a flowchart depicting selected elements of an embodiment of a method 400 for managing a thermal policy at the information handling system 202. The method 400 may be performed by the information handling system 100, the information handling system 202, and/or thermal policy management computing module 210, and with reference to FIGS. 1-2. It is noted that certain operations described in method 400 may be optional or may be rearranged in different embodiments.

The thermal policy management computing module 210 determines whether a thermal policy is enabled at the information handling system 202, at 402. The thermal policy management computing module 210 determines that the thermal policy is enabled (at 402), and in response, places the CPU 214 and the fan 216 in a default thermal management mode, at 404. The management computing module 210 can place the CPU 214 and the fan 216 in the default thermal management mode temporarily. In some examples, the default thermal management mode is an "optimized" thermal management mode that indicates a balance of fan speed of the fan 216 and processing capability of the CPU 214. The thermal policy management computing module 210 identifies a power associated with the CPU 214 while performing a workload and a time duration associated with the CPU 214 for performing the workload, at 406. The thermal policy management computing module 210 determines whether the values of the power and the time duration meet change criteria, at 408. That is, whether the values of the power and time duration are greater than thresholds for enabling adjustments to the CPU 214 and the fan 216. When the thermal policy management computing module 210 determines that the power and the time duration meet the change criteria (at 408), the thermal policy management computing module 210 adjusts the thermal management mode of the CPU 214 and the fan 216, and adjusts the ramp speed of the fan 216, at 410. That is, the thermal policy management computing module 210 adjusts the thermal management mode of the CPU 214 and the fan 216, and adjusts the ramp speed of the fan 216 based on the power and the time duration identified at 406.

In some examples, when the thermal policy management computing module 210 determines that the thermal policy is not enabled (at 402), the CPU 214 and the fan 216 are placed in the default thermal management mode, at 412, and the thermal management mode can be adjusted manually (by a user), at 414. The process returns to 402.

In some examples, when the thermal policy management computing module 210 determines that the power and the time duration do not meet the change criteria (at 408), the process returns to 404.

Figure 5:
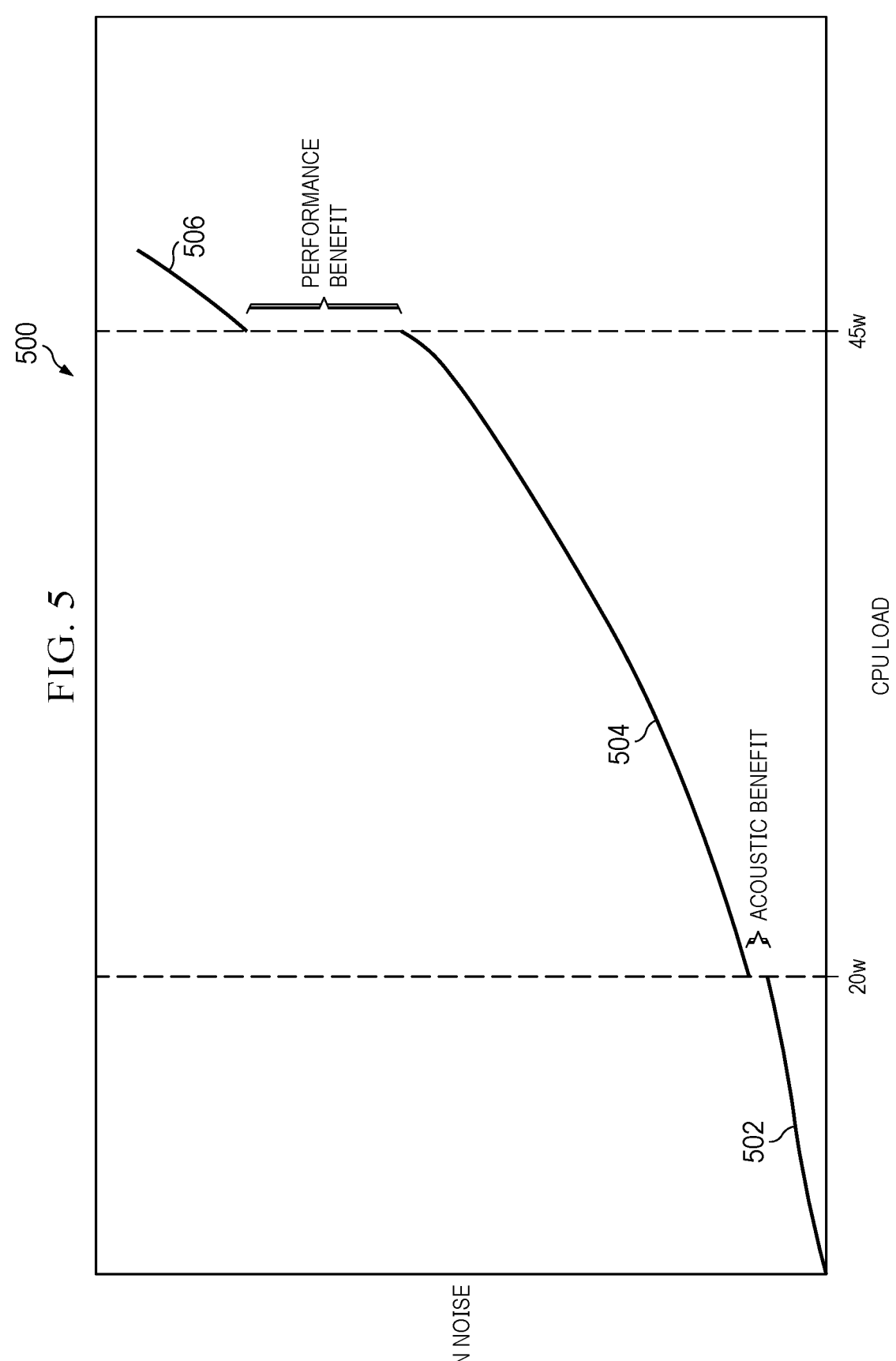
FIG. 5 illustrates a graph illustrating a use-case example of managing the thermal policy at the information handling system.

FIG. 5 illustrates a graph 500 illustrating a use case example of implementing the thermal policy. The x-axis of the graph 500 can indicate a power of the CPU 214 (e.g., in Watts) and the Y axis can indicate a fan noise of the fan 216 (e.g., in decibels). For example, for a CPU power less than 20 Watts and a workload duration greater than 5 mins, the thermal management mode is indicated by the line 502, with a fan ramp rate of ⅓ of default ramp rate. For example, for a CPU power between 20 Watts and 45 Watts and a workload duration of greater than 30 seconds, the thermal management mode is indicated by the line 504, with a fan ramp rate of 1× of the default ramp rate. For example, for a CPU power of greater than 45 Watts and a workload duration greater than 1 min, the thermal management mode is indicated by the line 506, with a fan ramp rate of ½ of the default ramp rate. The difference between the lines 504 and 502 at 20 Watts can indicate an acoustic benefit in fan noise. The difference between the lines 506 and 504 at 45 Watts can indicate a performance benefit at the CPU 214.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A computer-implemented method of managing a thermal policy of an information handling system, the method comprising:

determining that the thermal policy is enabled; and in response, perform the following:

identifying, at the first time, a first power associated with a central processing unit (CPU) of the information handling system;

identifying, at the first time, a first time duration of a first workload associated with the CPU;

accessing a table indicating, for combinations of workload time durations and CPU power, a ramp rate and a thermal management mode;

comparing the first power and the first time duration with the table to identify a first ramp rate and a first thermal management mode associated with the first power and the first time duration;

placing the CPU and a fan of the information handling system in the first thermal management mode and adjusting a fan speed of the fan based on the first ramp rate;

identifying, at a second time after the first time, a second power associated with a central processing unit (CPU) of the information handling system;

identifying, at the second time, a second time duration of a second workload associated with the CPU;

comparing i) the second power to a change power threshold and ii) the second time duration to a change time duration threshold;

determining, based on the comparing, that i) the second power meets the change power threshold and ii) the second time duration meets the change time duration threshold, then in response:

assessing the table;

comparing the second power and the second time duration with the table to identify a second ramp rate and a second thermal management mode associated with the second power and the second time duration; and placing the CPU and the fan in the second thermal management mode and adjusting the fan speed of the fan based on the second ramp rate;

determining, based on the comparing, that i) the second power does not meet the change power threshold and ii) the second time duration does not meet the change time duration threshold, then in response:

setting the thermal management mode to a default setting.

2. The computer-implemented method of claim 1, wherein the ramp rate is a rate of change of the fan speed of the fan.

3. The computer-implemented method of claim 2, wherein the thermal management mode indicates the fan speed of the fan and a processing parameter of the CPU.

4. The computer-implemented method of claim 1, further comprising:

determining that the thermal policy is not enabled; and in response to determining that the thermal policy is not enabled, setting the thermal management mode to the default setting.

5. An information handling system comprising a processor having access to memory media storing instructions executable by the processor to perform operations, comprising:

determining that the thermal policy is enabled; and in response, perform the following:

identifying, at the first time, a first power associated with a central processing unit (CPU) of the information handling system;

identifying, at the first time, a first time duration of a first workload associated with the CPU;

accessing a table indicating, for combinations of workload time durations and CPU power, a ramp rate and a thermal management mode;

comparing the first power and the first time duration with the table to identify a first ramp rate and a first thermal management mode associated with the first power and the first time duration;

placing the CPU and a fan of the information handling system in the first thermal management mode and adjusting a fan speed of the fan based on the first ramp rate;

identifying, at a second time after the first time, a second power associated with a central processing unit (CPU) of the information handling system;

identifying, at the second time, a second time duration of a second workload associated with the CPU;

comparing i) the second power to a change power threshold and ii) the second time duration to a change time duration threshold;

determining, based on the comparing, that i) the second power meets the change power threshold and ii) the second time duration meets the change time duration threshold, then in response:

assessing the table;

comparing the second power and the second time duration with the table to identify a second ramp rate and a second thermal management mode associated with the second power and the second time duration; and placing the CPU and the fan in the second thermal management mode and adjusting the fan speed of the fan based on the second ramp rate;

determining, based on the comparing, that i) the second power does not meet the change power threshold and ii) the second time duration does not meet the change time duration threshold, then in response:

setting the thermal management mode to a default setting.

6. The information handling system of claim 5, wherein the ramp rate is a rate of change of the fan speed of the fan.

7. The information handling system of claim 6, wherein the thermal management mode indicates the fan speed of the fan and a processing parameter of the CPU.

8. The information handling system of claim 5, the operations further comprising:

determining that the thermal policy is not enabled; and in response to determining that the thermal policy is not enabled, setting the thermal management mode to the default setting.

9. A non-transitory computer-readable medium storing software comprising instructions executable by one or more computers which, upon such execution, cause the one or more computers to perform operations comprising:

determining that the thermal policy is enabled; and in response, perform the following:

identifying, at the first time, a first power associated with a central processing unit (CPU) of the information handling system;

identifying, at the first time, a first time duration of a first workload associated with the CPU;

accessing a table indicating, for combinations of workload time durations and CPU power, a ramp rate and a thermal management mode;

comparing the first power and the first time duration with the table to identify a first ramp rate and a first thermal management mode associated with the first power and the first time duration;

placing the CPU and a fan of the information handling system in the first thermal management mode and adjusting a fan speed of the fan based on the first ramp rate;

identifying, at a second time after the first time, a second power associated with a central processing unit (CPU) of the information handling system;

identifying, at the second time, a second time duration of a second workload associated with the CPU;

comparing i) the second power to a change power threshold and ii) the second time duration to a change time duration threshold;

determining, based on the comparing, that i) the second power meets the change power threshold and ii) the second time duration meets the change time duration threshold, then in response:

assessing the table;

comparing the second power and the second time duration with the table to identify a second ramp rate and a second thermal management mode associated with the second power and the second time duration; and placing the CPU and the fan in the second thermal management mode and adjusting the fan speed of the fan based on the second ramp rate;

determining, based on the comparing, that i) the second power does not meet the change power threshold and ii) the second time duration does not meet the change time duration threshold, then in response:

setting the thermal management mode to a default setting.

10. The non-transitory computer-readable medium of claim 9, wherein the ramp rate is a rate of change of the fan speed of the fan.

11. The non-transitory computer-readable medium of claim 10, wherein the thermal management mode indicates the fan speed of the fan and a processing parameter of the CPU.

* * * * *